(12) United States Patent
Bruckmann et al.

(10) Patent No.: US 6,407,937 B2
(45) Date of Patent: Jun. 18, 2002

(54) ACTIVE OVERVOLTAGE PROTECTION APPARATUS FOR A BIDIRECTIONAL POWER SWITCH IN COMMON COLLECTOR MODE

(75) Inventors: Manfred Bruckmann, Nuremberg; Walter Springmann, Adelsdorf, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/816,251

(22) Filed: Mar. 23, 2001

(30) Foreign Application Priority Data

Mar. 24, 2000 (DE) .......................... 100 14 641

(51) Int. Cl.[7] .................. H02H 7/122; H02M 7/68; H02M 7/44
(52) U.S. Cl. ................. 363/56.05; 363/56.08; 363/97
(58) Field of Search ................. 363/56.06, 56.08, 363/95, 97, 133

(56) References Cited

U.S. PATENT DOCUMENTS

| | | | | |
|---|---|---|---|---|
| 4,242,629 A | * | 12/1980 | Shuey ........................ | 323/222 |
| 4,639,849 A | * | 1/1987 | Noworolski et al. ..... | 363/56.05 |
| 4,697,230 A | | 9/1987 | Neft .......................... | 363/163 |
| 5,055,990 A | * | 10/1991 | Miki et al. ............... | 363/56.05 |
| 5,077,651 A | * | 12/1991 | Kobayashi et al. ...... | 363/56.05 |
| 5,638,266 A | * | 6/1997 | Horie et al. ............... | 363/132 |
| 5,835,371 A | * | 11/1998 | Kume et al. .............. | 363/132 |
| 5,953,222 A | * | 9/1999 | Mizutani .................. | 363/56.05 |
| 6,169,672 B1 | * | 1/2001 | Kimura et al. ........... | 363/56.05 |
| 6,268,990 B1 | * | 7/2001 | Ogura et al. .............. | 361/91.7 |

OTHER PUBLICATIONS

IEEE Ind. Appl. Society Annual Meeting, New Orleans, Louisiana Oct. 5–9, 1997; "Novel Solutions for Protection of Matrix Converter to Three Phase Induction Machine". Peter Nielsen, Frede Blaabjerg, John K. Pedersen.
EPE '99, Lausanne, Sep. 1999; "Performance of a Two Steps Commutated Matrix Converter for AC–Variable–Speed Drives". M. Ziegler, W. Hofman.
IEEE 1998; "A Matrix Converter Without Reactive Clamp Elements for an Induction Motor Drive System". Axel Schuster, Aug. 1998.
IEEE Trans. on Ind. Appl., vol. 28, No. 3, "Theory and Design of a 30–hp Matrix Converter". Charles L Neft and Colin D. Scheuder, May/Jun. 1992.

* cited by examiner

*Primary Examiner*—Bao Q. Vu
(74) *Attorney, Agent, or Firm*—BakerBotts LLP

(57) ABSTRACT

The present invention relates to an active overvoltage protection apparatus for a bidirectional power switch which has two back-to-back in series connected semiconductor switches in the "common collector mode" topology. The overvoltage protection apparatus has a diode network which is linked to gate and emitter connections of the bidirectional power switch in the in such a manner as to provide a voltage clamping circuit for each of the semiconductor switches in the bidirectional power switch.

10 Claims, 6 Drawing Sheets

US 6,407,937 B2

ACTIVE OVERVOLTAGE PROTECTION APPARATUS FOR A BIDIRECTIONAL POWER SWITCH IN COMMON COLLECTOR MODE

FIELD OF THE INVENTION

The present invention relates to an active overvoltage protection apparatus for a bidirectional power switch which has two back-to-back in series connected semiconductor switches in the "common collector mode" topology.

BACKGROUND OF THE INVENTION

A bidirectional power switch of the type described above is known from the publication "Novel Solutions for Protection of Matrix Converter to Three Phase Induction Machine", printed in the Proceedings of the "IEEE Industry Applications Society Annual Meeting", New Orleans, La., Oct. 5–9, 1997, pages 1447 to 1454. The circuit diagram of a such bidirectional switch in the "common collector mode" topology is illustrated in more detail in FIG. 1. For comparison, FIG. 2 shows a bidirectional power switch in the "common emitter mode" topology, which is likewise known from the aforementione mentioned publication. These two bidirectional power switches each have two semiconductor switches 4 and 6, which are connected back-to-back in series. In FIG. 1, these two semiconductor switches 4 and 6 are connected back-to-back in series in such a manner that the two collector connections are electrically conductively connected to one another. In FIG. 2, the circuit formed by the two semiconductor switches 4 and 6 are connected back-to-back in series in such a manner that their emitter connections are electrically conductively connected. Since the emitter connections are linked, this circuitry is referred to as the common emitter mode. Insulated gate bipolar transistors (IGBT) are used as the semiconductor switches 4 and 6, and each have a reverse diode. The internal topology can be seen at the accessible connections of the bidirectional power switch 2. In the bidirectional power switch with the "common collector mode" topology shown in FIG. 1, the connections E1, E2, G1 and G2 are accessible on the power switch 2. In contrast to this, in the bidirectional power switch 2 with the "common emitter mode" topology shown in FIG. 2, the connections C1, C2, G1 and G2 are accessible.

According to the aforementioned publication, bidirectional power switches are used in a matrix converter. A matrix converter is a self-commutating direct converter. This self-commutating direct converter is a voltage intermediate-circuit converter without an intermediate circuit. The bidirectional power switches are arranged in a 3×3 switch matrix in the matrix converter. This arrangement of the bidirectional power switches results in three input phases being connected to three output phases. The actuation of the semiconductor switches or of the semiconductor switch in the power switches of the 3×3 switch matrix in each case results in a current path being connected in a bidirectional manner, that is to say from the input to the output and vice versa. One phase of the matrix converter is an arrangement of three bidirectional power switches, which produces a connection from the three mains system phases to one output phase. An LC filter is also connected to the input connections of the matrix converter, and is linked on the input side to a three-phase mains system. This LC filter, which is also referred to as an input filter, isolates pulse-frequency oscillations from the mains system. The size of this filter depends on the pulse frequency of the matrix converter. This self-commutating direct converter offers the advantage that, by virtue of the topology, it can feed back into the mains system, and produces sinusoidal mains system currents by means of an appropriately designed control system.

In addition to the already mentioned embodiments of the bidirectional power switch, there is also a further embodiment, which can likewise be found in the aforementioned cited publication. This embodiment is a semiconductor switch which is integrated in a diode bridge.

Since the matrix converter has no passive freewheeling circuits such as a voltage intermediate-circuit converter, high reverse voltages occur across the semiconductor switches owing to the inductances which are present in the circuit, particularly in the case of pulse blocking generated on the basis of an EMERGENCY-OFF (switching off the actuation pulses of all the semiconductor switches). These overvoltages can also occur as a consequence of an incorrectly initiated commutation sequence or due to failure of the actuation of bidirectional power switches. The output circuit is always interrupted in these situations. The interruption in the output circuit in conjunction with the inductances which are present in the circuit causes the overvoltages, which may result in destruction of the semiconductor switches.

An overvoltage protection apparatus is known from the aforementioned publication "Novel Solutions for Protection of Matrix Converter to Three Phase Induction Machine". This overvoltage protection apparatus has two 6-pulse diode bridges which are linked to one another on the DC-voltage side by means of a capacitor. On the AC-voltage side, the one 6-pulse diode bridge is connected to the input connections of the matrix converter. The other diode bridge is connected on the AC-voltage side to the output connections of the matrix converter. A resistor is connected electrically in parallel with the capacitor, and it discharges said capacitor. An LC filter is also connected to the input connections of the matrix converter, and is linked on the input side to a 3-phase mains system. This LC filter, which is also referred to as an input filter, isolates pulse-frequency oscillations from the mains system. The size of this filter depends on the pulse frequency of the matrix converter.

Any overvoltages which occur are rectified by the diode bridges, and are passed to the capacitor. This capacitor thus absorbs the commutation energy. This overvoltage protection apparatus, which is also the subject matter of U.S. Pat. No. 4,697,230, requires an initial charging circuit for the capacitor. This initial charging circuit is required to prevent overvoltages at twice the mains voltage from occurring when the matrix converter is switched on. Without initial charging, high peak currents likewise occur, which must be carried by the diodes in the diode bridge. The resistor is designed such that a predetermined amount of energy is discharged from the capacitor. This amount of energy depends on a predetermined difference between the mains system voltage and the capacitor voltage.

An overvoltage protection apparatus which has two 6-pulse diode bridges is also known from the publication "Performance of a two Steps Commutated Matrix Converter for AC-Variable-Speed Drives", printed in the EPE '99 Proceedings, Lausanne, September 1999, pages 1 to 9. Each of these two diode bridges has a capacitor on the DC-voltage side. These two capacitors are electrically connected in parallel. A zener diode and a pulse resistor are electrically connected in parallel with these two capacitors and are used to limit the voltage across the capacitors to a predetermined value. Furthermore, each bidirectional power switch has a varistor and a back-to-back series connected zener diode, by means of which the overvoltages across the bidirectional power switch are limited.

In the publication "A Matrix Converter without Reactive Clamp Elements for an Induction Motor Drive System", by Axel Schuster, printed in IEEE, 1998, pages 714 to 720, a number of varistors are provided as the overvoltage protection apparatus. A varistor is connected electrically in parallel with each semiconductor switch with each bidirectional power switch in the 3×3 switch matrix. These 18 varistors protect the 18 semiconductor switches of the nine bidirectional power switches against overvoltages.

When this overvoltage protection device is being used, the connection point of the two collector connections of the two back-to-back series connected semiconductor switches must be connected to the exterior in the bidirectional power switches in the common collector mode. It is also possible for the bidirectional power switch to be formed from individual semiconductor components. A varistor can be electrically connected in parallel with each semiconductor switch in a bidirectional power switch only if the collector connections, or their junction point, are or is accessible.

In the publication "Theory and Design of a 30-hp Matrix Converter", printed in IEEE Transactions on Industry Applications", Volume 28, Issue 3, May/June 1992, pages 546 to 551, an RCD circuit for the transistor which is integrated in a diode bridge is used as the overvoltage protection apparatus for a bidirectional power switch. The energy which is fed into the capacitor in the RCD circuit is normally converted into heat in the resistor in the RCD circuit. This RCD circuit is also referred to as a snubber circuit. The stored energy can also be used to supply energy for actuation of the semiconductor switches. This overvoltage protection apparatus is less suitable for a bidirectional power switch as shown in FIGS. 1 or 2. Furthermore, this overvoltage protection apparatus requires physical volume, with the magnitude of this physical volume being dependent on the commutation energy.

A voltage clamping circuit is disclosed in the publication "Beschaltung von SIPMOS-Transistoren" [Circuit of SIPMOS Transistors], printed in "Siemens Components", Volume 22, Issue 4, 1984, pages 157 to 159. This voltage clamping circuit is shown in more detail in FIG. 3 for a semiconductor switch 4, and is denoted by 8. This voltage clamping circuit 8 comprises a zener diode 10, in particular a high-voltage zener diode, which is also referred to as a transil diode, and a decoupling diode 12. This voltage clamping circuit 8 is connected between the collector connection C and the gate connection G of the semiconductor switch 4. The semiconductor switch 4 is an insulated gate bipolar transistor (IGBT) with a reverse diode. The decoupling diode 12 disconnects the voltage clamping circuit 8 from the gate connection G of the semiconductor switch 4 when the semiconductor switch 4 is switched on. When the semiconductor switch 4 is in the switched-off state, the semiconductor switch 4 is actuated automatically as soon as its collector-emitter voltage exceeds the sum of the zener voltage of the transil diode 10, the threshold voltage of the decoupling diode 12 and the gate-emitter threshold voltage. Any overvoltage which occurs across the semiconductor switch 4 is thus actively limited by this semiconductor switch 4, although losses occur in the semiconductor switch 1t and in the transil diode 10.

This active overvoltage protection apparatus can be used directly for a bidirectional power switch in the "common emitter mode" topology (FIG. 2). This means that a voltage clamping circuit 8 is electrically connected in parallel with the collector-gate path in each of the two semiconductor switches 4 and 6 in the bidirectional power switch 2 in the common emitter mode. This can also be achieved without any major complexity since the required connections, the collector connection C and the gate connection G, are accessible.

This known voltage clamping circuit 8 cannot be used directly in a bidirectional power switch in the common collector mode. For circuit 8 to be used, the common collector connection must be connected to the exterior from the bidirectional power switch 2. This demands a special form of the bidirectional power switch, which may need to be produced on a customer-specific basis. Any deviation from standard components increases the price of a product on the market.

SUMMARY OF THE INVENTION

The present invention is based on the object of specifying an active overvoltage protection apparatus for a bidirectional power switch in the common collector mode. Since the bidirectional power switch in the common collector mode has an associated diode network which is linked to the accessible gate and emitter connections of the bidirectional power switch in such a manner that the function of a voltage clamping circuit is provided for each of its two semiconductor switches, any overvoltage which occurs is no longer absorbed by the overvoltage protection apparatus, but is actively limited by one of the two semiconductor switches in the bidirectional power switch. The polarity of the reverse voltage applied to the bidirectional power switch determines which of the two semiconductor switches in the bidirectional power switch will be automatically activated. The diode network as a circuit in a bidirectional power switch in the common collector mode results in an active overvoltage protection apparatus for such a power switch.

In another embodiment of the present invention, the overvoltage protection apparatus has a voltage measurement apparatus, two voltage comparison devices and two decoupling diodes. The voltage measurement apparatus is electrically connected to the emitter connections of the bidirectional power switch in the common collector mode, and its two outputs are each linked to an actual input of the two voltage comparison devices. On the output side, each voltage comparison device is linked by means of the decoupling diode and by means of a driver stage to a gate connection of the bidirectional power switch. A predetermined reference value is applied to the reference value input of each voltage comparison device. If the actual value which is determined is greater than or equal to the predetermined reference value, the associated semiconductor switch in the bidirectional power switch in the common collector mode is actuated, so that this semiconductor switch can actively limit the overvoltage which occurs. In a preferred embodiment, a driver stage is connected between each of the junction points of the series circuits and the gate connections of the bidirectional power switch in the common collector mode. This greatly reduces the current load on each of the zener diodes.

One embodiment of the diode network, has two zener diodes and two decoupling diodes. one zener diode and one decoupling diode are in each case electrically conductively connected to one another on the anode side. Each of these series circuits is linked to a gate connection and to an emitter connection of in each case one semiconductor switch in the bidirectional power switch. Each series circuit thus forms a known voltage clamping circuit, although this is not electrically connected to the collector-gate path of a semiconductor switch. These two voltage clamping circuits are connected, crossed over, to the accessible connections of the bidirectional power switch-n the common collector mode.

In another embodiment of the diode network, the network likewise has two zener diodes and two decoupling diodes, with one zener diode and one decoupling diode each being linked to one another on the cathode side. These junction points are each connected to a gate connection of the bidirectional power switch. These two series circuits are electrically linked to one another in such a manner that the two zener diodes are electrically conductively connected on the anode side. The associated decoupling diodes are each connected on the anode side to an emitter connection of the bidirectional power switch. In contrast to the first embodiment, the decoupling diodes need not be high blocking capability diodes.

In a further embodiment of the diode network, the network has two decoupling diodes and one zener diode, which is integrated in a diode bridge. The free connections of this diode bridge are electrically conductively connected to the gate connections of the bidirectional power switch in the common collector mode. The decoupling diodes are each connected electrically in parallel, but in the reverse direction, to a gate-emitter path of a semiconductor switch in the bidirectional power switch in the common collector mode. This refinement of the diode network now requires only one zener diode, in particular a high blocking capability zener diode, thus significantly reducing the complexity and the costs of the active overvoltage protection apparatus.

In yet another embodiment of the diode network, the network has four diodes and one zener diode. On the anode side, this zener diode is linked to the anodes of the two diodes which, for their part, are connected to the gate connections of the bidirectional power switch. On the cathode side, the zener diode is connected to the cathodes of two diodes which, for their part, are linked to the emitter connections of the bidirectional power switch. In this embodiment of the diode network not only is one high blocking capability zener diode saved, but also two decoupling diodes. The complexity for an active overvoltage protection apparatus for a bidirectional power switch in the common collector mode has thus been further simplified.

BRIEF DESCRIPTION OF THE DRAWINGS

The present invention is further disclosed with reference to the drawings, which show a number of embodiments of an active overvoltage protection apparatus according to the invention, schematically.

DETAILED DESCRIPTION OF THE PRESENT INVENTION

Figure 1:
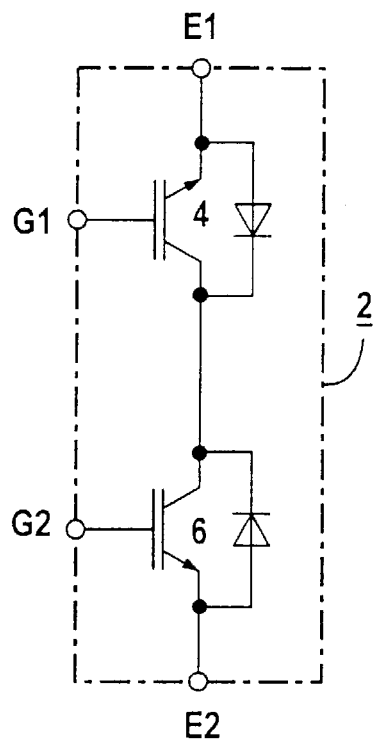
FIG. 1 illustrates a circuit diagram of a known bidirectional power switch in the common collector mode.
Figure 2:
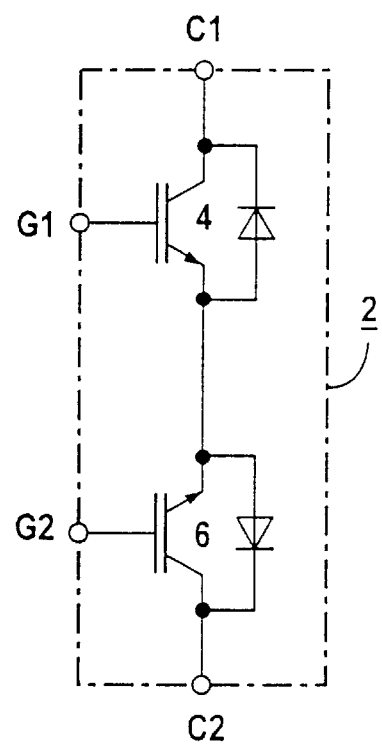
FIG. 2 illustrates a circuit diagram of a known bidirectional power switch in the common emiter mode.
Figure 3:
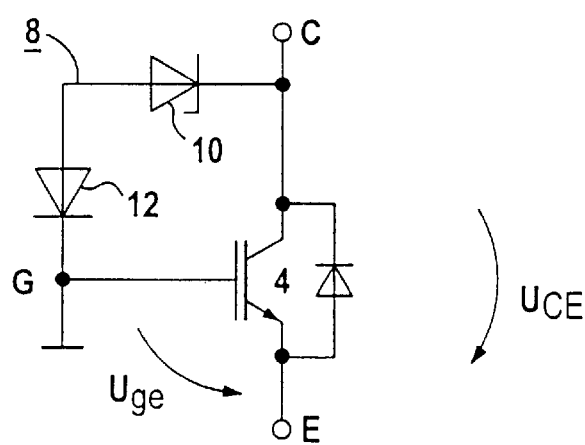
FIG. 3 illustrates a known voltage clamping circuit for a semiconductor switch.
Figure 4:
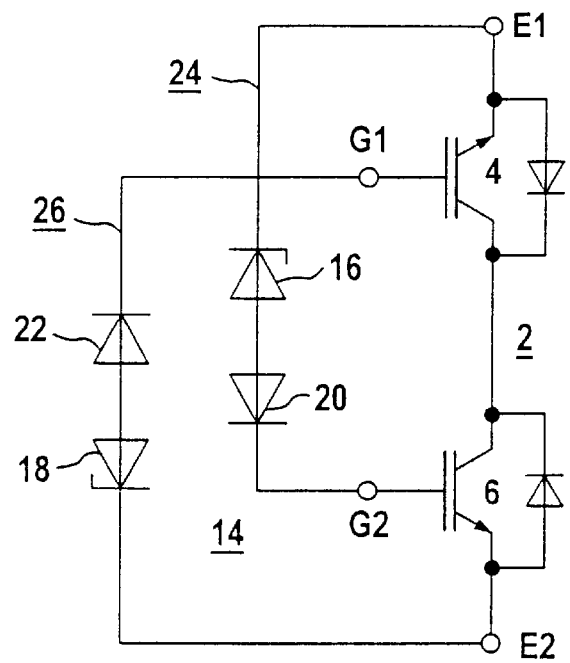
FIG. 4 illustrates a first embodiment of the diode network of the active overvoltage protection apparatus according to the present invention.

FIG. 4 shows a first embodiment of the diode network 14 of the active overvoltage protection apparatus according to the invention. This diode network 14 has two zener diodes 16 and 18 and two decoupling diodes 20 and 22. The zener diode 16 is electrically conductively connected on the anode side to the anode of the decoupling diode 20. The zener diode 18 and the decoupling diode 22 are likewise electrically conductively connected to one another on the anode side. The two series circuits 24 and 26 are electrically conductively linked, crossed over, to the accessible connections E1, E2, G1, G2 of the bidirectional power switch 2. This means that the series circuit 24 connects the connection E1 to the connection G2 of the bidirectional power switch 2, with the series circuit 26 connecting the connection E2 to the connection G1.

If an overvoltage occurs when this bidirectional power switch 2 in the common collector mode is in the switched-off state, that is to say the two back-to-back series connected semiconductor switches 4 and 6 are switched off, either of the semiconductor switches 4 or 6 in the bidirectional power switch 2 is actuated as soon as the value of the overvoltage exceeds the sum value of the zener voltage of the zener diode 16 or 18, the threshold voltage of the decoupling diode 20 or 22 and the gate-emitter threshold voltage of the semiconductor switch 6 or 4. The polarity of the reverse voltage which is present across the bidirectional power switch 2 determines which of the semiconductor switches in the bidirectional power switch 2 is actuated. Any reverse voltage which is present across the bidirectional power switch 2 in the common collector mode is thus actively limited to a predetermined value. It is thus no longer possible for any overvoltage to occur across the bidirectional power switch 2 in the common collector mode. The diode network 14, which in this embodiment has high blocking capability diodes, is integrated in the two drive circuits. It thus does not occupy any additional physical volume.

Figure 5:
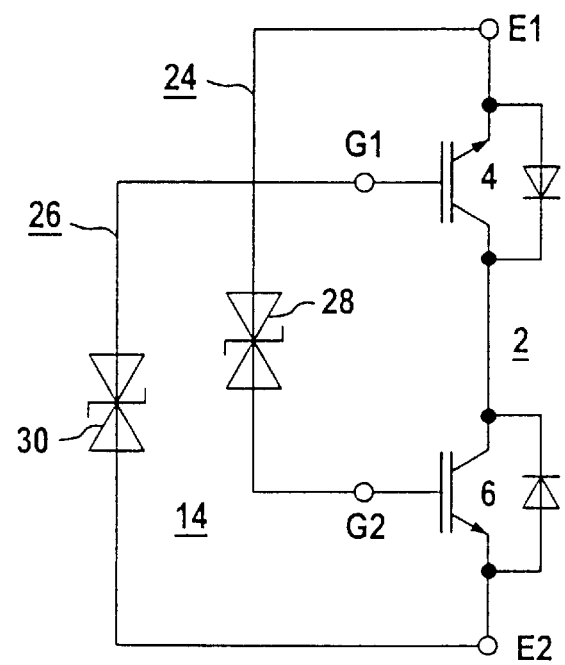
FIG. 5 illustrates an advantageous variant of the diode network as shown in FIG. 4.

FIG. 5 illustrates an advantageous variant of the diode network 14 of the active overvoltage protection apparatus. A bidirectional high blocking capability zener diode 28 or 30, respectively, is in each case provided instead of the diodes 16, 20 and 18, 22 in the series circuits 24 and 26. This bidirectional high blocking capability zener diode 28 or 30 is also referred to as a bidirectional transil diode. Since a bidirectional high blocking capability zener diode 28 or 30, respectively, is in each case used instead of the two diodes 16, 20 or 18, 22, respectively, this saves installation space.

Figure 6:
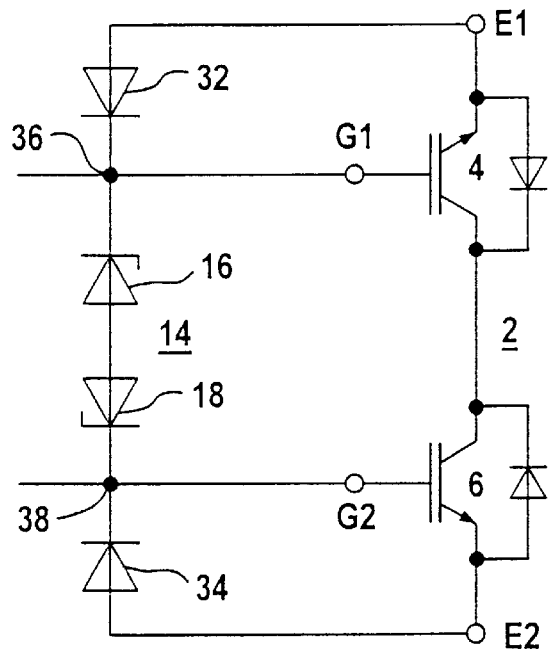
FIG. 6 illustrates a second embodiment of the diode network of the active overvoltage protection apparatus according to the present invention.

FIG. 6 shows a second embodiment of the diode network 14 of the active overvoltage protection apparatus. This diode network 14 likewise has two high blocking capability zener diodes 16 and 18, which are also referred to as transil diodes, and two low blocking capability decoupling diodes 32 and 34. The two transil diodes 16 and 18 are connected back-to-back in series between the two accessible connections G1 and G2 of the bidirectional power switch 2 in the common collector mode. The low blocking capability decoupling diode 32 is connected electrically in parallel, in the reverse direction, to the connections G1 and E1 while, in contrast, the low blocking capability decoupling diode 34 is connected electrically in parallel, in the reverse direction, to the connections G2 and E2.

In accordance with FIG. 6, an over-voltage which is relevant for the semiconductor switch 6 occurs at the connections E1, E2 on the bidirectional power switch 2 in the common collector mode, that is to say the collector of the semiconductor switch 6 is positive with respect to the emitter. When an overvoltage such as this occurs, the decoupling diodes 32 and the transil diode 18 are polarized in the forward direction, and the transil diode 16 and the decoupling diode 34 are polarized in the reverse direction. In the event of a fault, this voltage increases to a value at which the transil diode 16 breaks down (corresponding to its zener voltage) and current passes through thus charging the gate of the semiconductor switch 6. If the control voltage is sufficiently high, the semiconductor 6 enters the active area and in consequence limits any further voltage rise. The circuit operates in an analogous manner in the event of an overvoltage which is relevant for the semiconductor switch 4 (collector positive with respect to the emitter of the semiconductor switch 4).

Figure 7:
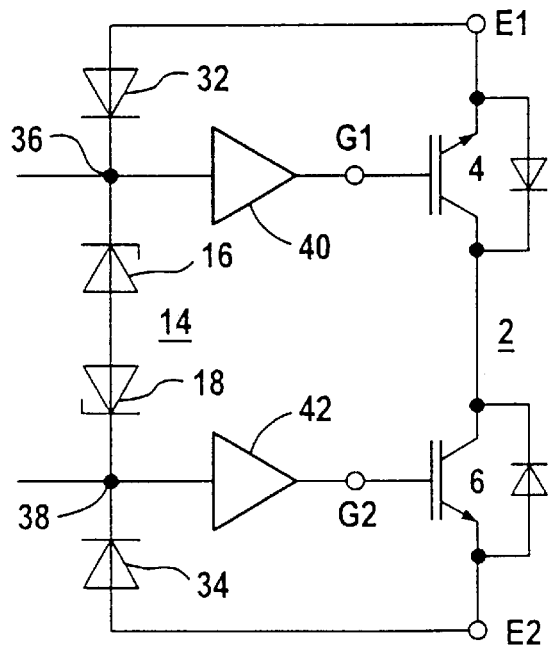
FIGS. 7–9 illustrates advantageous variants of the embodiment shown in FIG. 6.

FIG. 7 shows a variant of the diode network 14 (as shown in FIG. 6) of the active overvoltage protection apparatus for a bidirectional power switch 2 in the common collector mode, in more detail. This variant differs from the embodiment shown in FIG. 6 in that the cathode connections 36 and 38 of the diodes 16, 32 and of the diodes 18, 34 are not connected directly to the gate connections G1 and G2 of the bidirectional power switch 2, but are each connected to one input of a driver stage 40 and 42 of the semiconductor switches 4 and 6 of the bidirectional power switch 2. Each driver stage 40, 42 is a component of an actuation device (which is not shown in any more detail) of the respective semiconductor switch 4 or 6. The only change is the current load on the diodes 16, 18, 32 and 34 in the diode network 14. Since, in this variant of the diode network 14, the diodes 32, 16 and 34, 18 do not have to carry the gate current, components with lower design ratings can be used, and their cost is less. The required gate current is generated by the driver stage 40 or 42, respectively.

Figure 8:
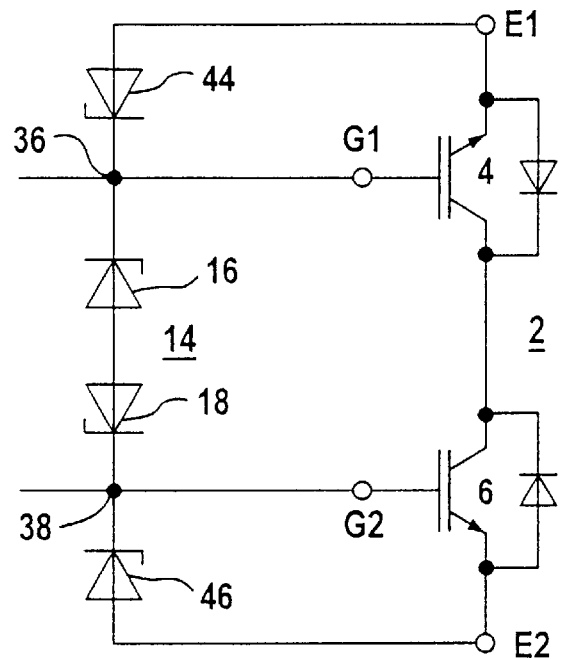

FIG. 8 shows another variant of the of the diode network 14 (as shown in FIG. 6) of the active overvoltage protection apparatus of the bidirectional power switch 2 in the common collector mode. This variant differs from what is shown in FIG. 6 in that zener diodes 44 and 46 having a lower zener voltage, for example 16 V, are respectively used instead of the low blocking capability decoupling diodes 32 and 34. Since a zener diode 44 or 46 is respectively used as the decoupling diode 32 or 34, the decoupling diode at the same time carries out a second function. This second function is to limit the gate-emitter voltage of the semiconductor switch 4 or 6 to a predetermined value.

Figure 9:
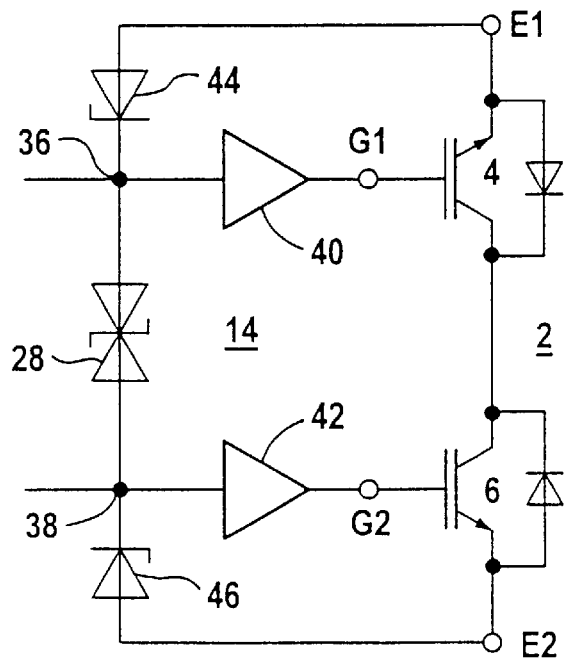

FIG. 9 shows another variant of the diode network 14 (as shown in FIG. 6) of the active overvoltage protection apparatus in which, in contrast to the variant shown in FIG. 8, a bidirectional transit diode 46 is used instead of the two back-to-back series connected transit diodes 16 and 18 between the two connections G1 and G2 of the bidirectional power switch 2. As in FIG. 7, this diode network 14 is arranged upstream of the driver stages 40 and 42 of the semiconductor switches 4 and 6 of the bidirectional power switch 2. However, as in FIGS. 6 and 8, this variant of the diode network 14 can also be connected directly to the accessible connections G1, G2, E1, E2 of the bidirectional power switch 2 in the common collector mode.

Figure 10:
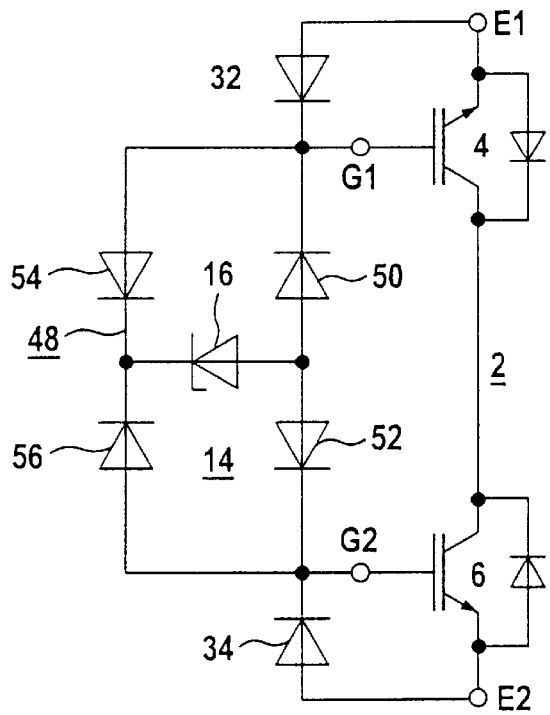
FIG. 10 illustrates a third embodiment of the (diode network of the active overvoltage protection apparatus according to the present invention.

FIG. 10 illustrates a third embodiment of the diode network 14 of the active overvoltage protection apparatus for a bidirectional power switch 2 in the common collector mode. This diode network 14 has two decoupling diodes 32 and 34 and a transil diode 16 which is embedded in a diode bridge 48. The free ends of this diode bridge 48 are electrically conductively connected to the connections G1 and G2 of the bidirectional power switches 2. The circuitry of the decoupling diodes 32 and 34 is identical to that of the decoupling diodes 32 and 34 in the second embodiment of the diode network 14 shown in FIG. 6. The difference from the configuration shown in FIG. 6 is that one transit diode 16, which is embedded in a diode bridge 48, is used instead of two back-to-back series connected transil diodes 16, 18. In this case, the anode side of the transil diode 16 is linked to the anodes of two diodes 50, 52 in the diode bridge 48 which, for their part, are connected on the cathode side to the connections G1 and G2 of the bidirectional power switch 2. On the cathode side, the transil diode 16 is connected to the cathodes of two further diodes 54, 56 in the diode bridge 48 which, for their part, are linked on the anode side to the connections G1 and G2 of the bidirectional power switch 2. This embodiment of the diode network 14 has the smallest number of high-voltage zener diodes.

Figure 11:
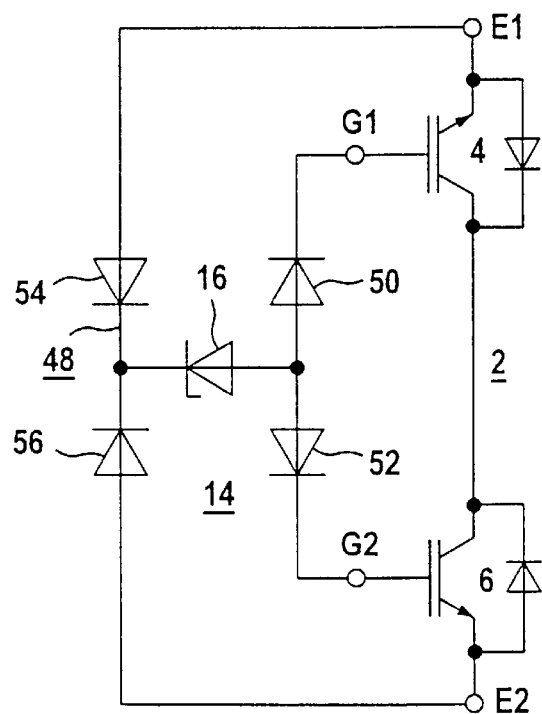
FIG. 11 illustrates a fourth embodiment of the diode network of the active overvoltage protection apparatus according to the invention.

FIG. 11 illustrates a fourth embodiment of the diode network 14 of the active overvoltage protection apparatus for a bidirectional power switch 2 in the common collector mode. In contrast to the embodiment shown in FIG. 10, this embodiment no longer has any decoupling diodes 32 and 34. To this end, the further diodes 54 and 56 in the diode bridge 48 are now electrically conductively connected on the anode side to the connections E1 and E2 of the bidirectional power switch 2, rather than to the connections G1 and G2. The number of diodes in the diode network 14 has thus been further reduced, with only one transil diode 16 being required for a bidirectional power switch 2 in the common collector mode.

Figure 12:
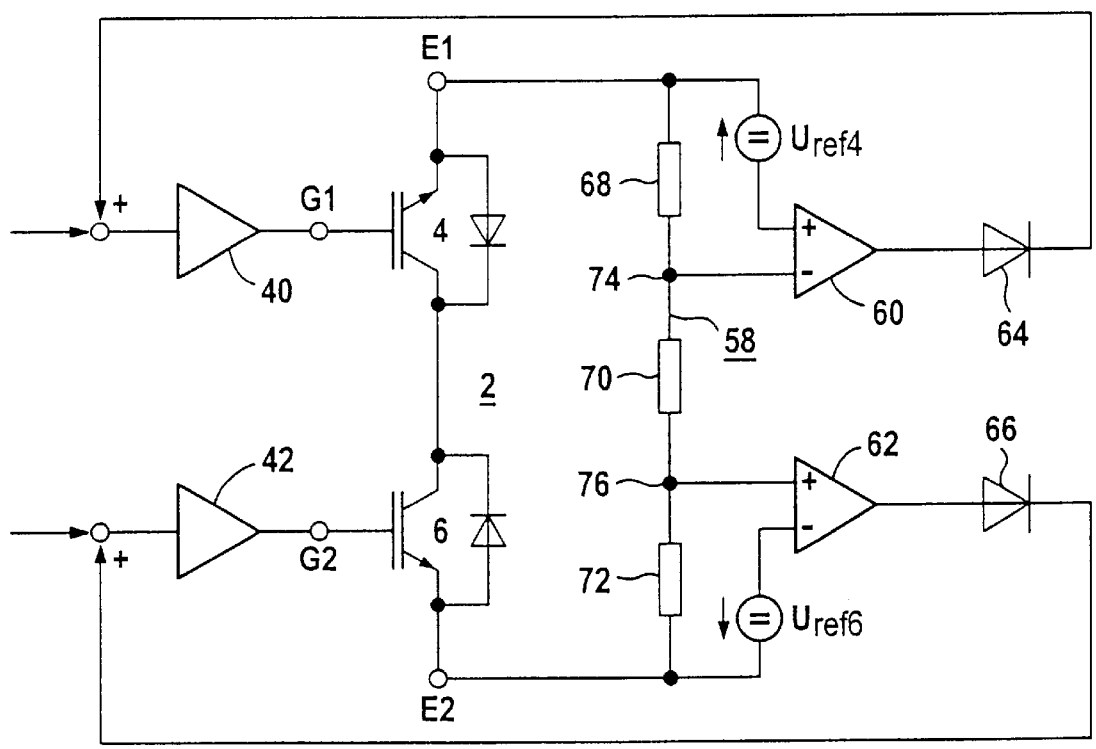
FIG. 12 illustrates yet a further embodiment of the overvoltage protection apparatus according to the invention.

Instead of the diode network 14, the active overvoltage protection apparatus of the bidirectional power switch 2 in the common collector mode may also have a voltage measurement device 58, two voltage comparison devices 60 and 62, and two decoupling diodes 64 and 66 as shown in FIG. 12. The voltage measurement device 58 comprises three resistors 68, 70, 72 which are electrically connected in series, and of which only the resistor 70 is in the form of a high-voltage resistor. This voltage measurement device 58 is connected electrically in parallel with the connections E1 and E2 of the bidirectional power switch 2. The connection points 74 and 76 of the resistors 68, 70 and 70, 72 each form one output of the voltage measurement device 58, at each of which a voltage actual value of the semiconductor switch 4 or e, respectively, can be tapped off. These outputs 74 and 76 of the voltage measurement device 58 are respectively connected to an actual value input of the voltage comparison devices 60 and 62. A predetermined voltage reference value $U_{ref4}$ or $U_{ref6}$, respectively, is present at the reference value input of these voltage comparison devices 60 and 62. On the output side, the voltage comparison devices 60 and 62, respectively, are electrically conductively connected by means of the respective decoupling diode 64 or 66 to one input of the respective driver stage 40 or 42 of the actuation circuit (which is not shown in any more detail) of the respective semiconductor switch 4 or 6 of the bidirectional power switch 2. As soon as the voltage actual value which has been determined for the semiconductor switch 4 or 6 is greater than or equal to the predetermined voltage reference value $U_{ref4}$ or $U_{ref6}$, the corresponding driver stage 40 or 42 is actuated, so that a current is generated in order to charge the gate of the semiconductor switch 4 or 6. If the control voltage is sufficiently high, the semiconductor switch 4 or 6 changes to the active region, and in consequence limits any further voltage rise. This active overvoltage protection apparatus is advantageously used in a high-power bidirectional power switch 2.

What is claimed is:

1. An active overvoltage protection apparatus for a bidirectional power switch having two back-to-back in series connected semiconductor switches and gate and emitter connections to provide a "common collector mode" topology, comprising a diode network which is linked to the gate and emitter connections to provide a voltage clamping circuit for each of the two semiconductor switches.

2. The apparatus according to claim 1 wherein the diode network has two zener diodes and two decoupling diodes, the zener diodes each being linked on the cathode side to an emitter connection, and the decoupling diodes each being linked on the cathode side to a corresponding one of the gate connections and wherein the zener diodes and decoupling diodes are linked on the anode side in such a manner that one of the emitter connections of one of the semiconductor switches is in each case connected to the gate connection of the other semiconductor switch.

3. The apparatus according to claim 1 wherein the diode network has two zener diodes and two decoupling diodes, the zener diodes being connected to one another on the anode side and each being connected on the cathode side to a corresponding one of the gate connections of the bidirectional power switch, the decoupling diodes each being linked on the cathode side to a corresponding one of the gate connections of the bidirectional power switch and each being linked on the anode side to an emitter connection of the bidirectional power switch.

4. The apparatus according to claim 3, comprising a driver stage connected between the diode network and the gate connections of the bidirectional power switch in such a manner that the junction on the cathode side of each of the zener diodes and the decoupling diodes in the diode network is linked to an input of the driver stage.

5. The apparatus according to claim 1, wherein the diode network has two decoupling diodes and a zener diode connected in a diode bridge, and each decoupling diode is linked on the anode side to one of the emitter connections, and on the cathode side to one of the gate connections of the bidirectional power switch and further wherein the zener diode is connected on the anode side to anode connections of two diodes in the diode bridge, and on the cathode side to cathode connections on two additional diodes in the diode bridge and wherein the free ends of the diode bridge are linked to a corresponding one of the gate connections of the bidirectional power switch (2).

6. The apparatus according to claim 1 wherein the diode network has a zener diode and four diodes, the zener diode being linked on the anode side to the anode connections a first two of the diodes which are each connected on the cathode side to one of the gate connections of the bidirectional power switch and wherein the zener diode is linked on the cathode side with the cathode connections of a second two of the diodes which are each connected on the anode side to one of the emitter connections of the bidirectional power switch.

7. The apparatus according to claim 2 comprising two bidirectional transil diodes and decoupling diodes wherein each bidirectional transil diode is linked to the emitter connection of one of the semiconductor switches and to the gate connection of the other of the semiconductor switches in the bidirectional power switch.

8. The apparatus according to claim 1 wherein the diode network comprises two zener diodes having a low breakdown voltage.

9. The apparatus according to as claim 1 wherein the diode network comprises a bidirectional transil diode.

10. An active overvoltage protection apparatus for a bidirectional power switch having two back-to-back in series connected semiconductor switches in the "common collector mode" topology, comprising a voltage measurement device, voltage comparison devices and two decoupling diodes wherein the voltage measurement device is connected upstream of, and electrically in parallel with, the bidirectional power switch and wherein each voltage comparison device has an input side with a voltage actual value and a predetermined voltage reference value, wherein each decoupling diode is linked on the anode side to an output of one of the voltage comparison devices and on the cathode side to an input of a driver stage of the semiconductor switches.

* * * * *